(12) United States Patent
Maier et al.

(10) Patent No.: US 7,242,177 B2
(45) Date of Patent: Jul. 10, 2007

(54) METHOD AND CIRCUIT ARRANGEMENT FOR CURRENT MEASUREMENT

(75) Inventors: Reinhard Maier, Herzogenaurach (DE); Jürgen Rupp, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 10 days.

(21) Appl. No.: 10/524,561

(22) PCT Filed: Aug. 7, 2003

(86) PCT No.: PCT/DE03/02660

§ 371 (c)(1),
(2), (4) Date: Feb. 14, 2005

(87) PCT Pub. No.: WO2004/021021

PCT Pub. Date: Mar. 11, 2004

(65) Prior Publication Data

US 2006/0164069 A1   Jul. 27, 2006

(30) Foreign Application Priority Data

Aug. 14, 2002   (DE) .................. 102 37 920

(51) Int. Cl.
*G01R 1/20*   (2006.01)
*G01R 27/00*   (2006.01)

(52) U.S. Cl. .................... 324/158.1; 324/126

(58) Field of Classification Search ............ None
See application file for complete search history.

(56) References Cited

U.S. PATENT DOCUMENTS

| | | | | |
|---|---|---|---|---|
| 3,289,078 A | | 11/1966 | Ratz et al. | |
| 3,522,515 A | | 8/1970 | Harner et al. | |
| 3,697,703 A | * | 10/1972 | Clark et al. | 704/203 |
| 3,705,359 A | * | 12/1972 | Kappes | 341/143 |
| 4,757,420 A | * | 7/1988 | Saletta et al. | 361/187 |
| 4,760,343 A | | 7/1988 | Vaillancourt et al. | |
| 5,181,026 A | * | 1/1993 | Granville | 340/870.28 |
| 5,585,717 A | * | 12/1996 | Eriksson et al. | 324/166 |
| 5,734,725 A | * | 3/1998 | Pritchard | 381/61 |
| 6,028,426 A | | 2/2000 | Cameron et al. | |
| 6,184,725 B1 | * | 2/2001 | Mohr | 327/91 |
| 7,015,702 B2 | * | 3/2006 | Rupp | 324/607 |
| 2003/0155930 A1 | * | 8/2003 | Thomsen | 324/522 |
| 2004/0061506 A1 | * | 4/2004 | Rupp | 324/522 |

FOREIGN PATENT DOCUMENTS

DE   198 02 831 A1   8/1998

(Continued)

*Primary Examiner*—Paresh Patel
(74) *Attorney, Agent, or Firm*—Harness, Dickey & Pierce, P.L.C.

(57) ABSTRACT

A method with corresponding circuit arrangement is disclosed, whereby for evaluation of a measured signal arising as an analogue value with a potential greater than zero potential in a measuring device requiring a supply current, the measured information therefrom is transmitted as a digital signal to an analytical unit lying at earth potential after an A/D conversion. The generated digital signal thus provides the clock signal for a modulation of the supply current and thus also carries out the function of the carrier for the information content of the measured signal. Curved characteristic lines for compression/decompression of the signals are used. Suitable devices for temperature compensation may be similarly provided.

14 Claims, 5 Drawing Sheets

FOREIGN PATENT DOCUMENTS

| | | |
|---|---|---|
| DE | 199 10 755 A1 | 10/1999 |
| DE | 101 05 982 A1 | 10/2002 |
| FR | 2 541 777 | 8/1984 |
| JP | 01-250766 | 10/1989 |
| JP | 10170615 A * | 6/1998 |
| SU | 1117537 A | 10/1984 |

* cited by examiner

METHOD AND CIRCUIT ARRANGEMENT FOR CURRENT MEASUREMENT

This application is the national phase under 35 U.S.C. § 371 of PCT International Application No. PCT/DE2003/002660 which has an International filing date of Aug. 7, 2003, which designated the United States of America and which claims priority on German Patent Application number DE 102 37 920.3 filed Aug. 14, 2002, the entire contents of which are hereby incorporated herein by reference.

FIELD OF THE INVENTION

The invention generally relates to a method for current measurement. In addition, the invention also generally relates to the associated circuit arrangement.

BACKGROUND OF THE INVENTION

One known method for current measurement involves measuring the voltage drop across a shunt resistor. Digital/analog converters (ADCs), which convert the analog measurement signal into a digital measured value, are frequently used in modern measuring and switching devices for the purpose of measurement. In this case, the following problems may arise:

a) The measurement signal has a high dynamic range, since small currents (<10% of the rated current) still have to be measured with an acceptable resolution and large currents ($\geq 10$ times the rated current) also still have to be detected.
b) Accuracy must not be inadmissibly impaired by the effect of ambient temperature.
c) The electronic components (ADC, processor etc.) need to be supplied with current. In this case, two (DC) decoupled power supplies are frequently required, since there are components both at a low potential (zero potential or artificial star point) and at a high outer conductor potential.
d) In addition to the outer conductor current, the outer conductor voltage must also frequently be measured against zero potential.
e) In the event of an overload or a short circuit, the main circuit must be disconnected.

The applicant's earlier specification DE 101 05 982 A1, which was unpublished at the priority date of the present application, discloses a method in which a measurement signal is at a higher potential than zero potential. Further, there is a measuring device that requires a supply current. The measurement signal occurrs in the form of an analog value and its measurement information is transmitted, after A/D conversion, in the form of a digital signal to an evaluation unit which is at ground potential. Further, after A/D conversion of the measurement signal, the digital signal produced providing the clock for modulating the supply current, which thus likewise performs the function of the carrier for the information content of the measurement signal.

In order to overcome the abovementioned problems, the following measures are taken in this case:

a) High dynamic response: analog/digital converters having a linear characteristic curve and a correspondingly high resolution (number of bits) are used.
b) Effect of ambient temperature on accuracy: (expensive) special alloys which have a low temperature coefficient are selected for the shunt.
c) The voltage is supplied directly to an ADC at a low potential using either voltage converters, i.e. transformers, or voltage dividers.

SUMMARY OF THE INVENTION

It is an object of an embodiment of the invention to propose technical improvements for a method and to provide a suitable circuit arrangement for this purpose.

An embodiment of the invention may achieve the object by virtue of the measures of the method. The arrangement may further specify associated circuit arrangements.

An embodiment of the invention includes the following:

a) Dynamic response: the ADC is not implemented with a linear characteristic curve but rather with a rounded characteristic curve. As a result, the measurement signal is compressed and a smaller number of bits suffices for the same dynamic response. This method, which is known as compression, is thus intended to be advantageously applied to current measurement. Possible characteristic curves are logarithmic characteristic curves (with special handling of the zero point), which have the advantage of constant relative accuracy, i.e. errors relative to the measured value, or a root function, which affords the advantage of simple expansion by squaring, for example in a microcontroller.
b) Effect of ambient temperature on accuracy: a special resistance alloy is not selected for the shunt but rather use is made of a piece of rail which is present anyway and comprises conductor material. In order to increase the resistance (for the shunt) locally, the cross section is reduced by constrictions. The high temperature coefficient of copper is compensated for by virtue of the ADC having a reference voltage which has a temperature coefficient that, as far as possible, is of the same magnitude and is synchronous. The measuring unit, which is at a high potential anyway, can be installed in such a manner that it is in good thermal contact with the copper rail used, so that both are at the same temperature level.
c) Voltage supply: DE 101 05 982 A1 (already mentioned), entitled "Verfahren zur Auswertung eines Messwertes und zugehörige Schaltungsanordnung" [Method for evaluating a measured value, and associated circuit arrangement], relates, inter alia, to a method for current measurement at potential, in which to obtain the supply current for the components which are at potential directly from the system and to transmit the measured value at a low potential by modulating the supply current. This basic idea can now advantageously be expanded to the effect that, in addition to the supply current for the components at a high potential, the supply current for the components which are at a low potential is also obtained directly from the system. In order to prevent the power loss from becoming unnecessarily high, some of the voltage dividers may also be implemented using nonreactive resistors and some may be implemented using capacitors.
d) Outer conductor voltage measurement: the outer conductor voltage is measured with the aid of a voltage divider which is present anyway. To this end, either the voltage drop across the upper resistor $R_{Lx}$ is supplied at potential to an additional channel of the measuring device or the voltage drop across the lower resistor $R_x$ is supplied at a low potential to an ADC in the evaluation device. In this respect, reference is made specifically to FIG. 6, which is described further below.

At least one of the following advantages over the prior art may be achieved, in particular, with an embodiment of the invention:
a) High dynamic response: the proposed method has the advantage that lower-cost ADCs which do not have to provide a high resolution over the entire measurement range can be used.
b) Effect of ambient temperature on accuracy: the proposed method of an embodiment has the advantage that an expensive special alloy does not have to be used but rather use is made of a piece of rail which is present anyway and includes conductor material. In addition, fastening (screwing, riveting) of the resistor element to the copper is dispensed with. High measurement accuracy is nevertheless achieved as a result of temperature compensation.
c) Voltage supply: the proposed method has the advantage that the costs, weight and space requirement are reduced.
d) The voltage drop across the resistors occurs anyway in the case of the current-measuring device described and can thus be used in a cost-effective manner for the additional voltage measurement using simple devices/methods.

BRIEF DESCRIPTION OF THE DRAWINGS

Further details and advantages of an embodiment of the invention may become apparent from the figure description (below) of exemplary embodiments with reference to the drawings in conjunction with the patent claims. In the drawings:

DETAILED DESCRIPTION OF THE EXEMPLARY EMBODIMENTS

The text below is based essentially on the earlier specification DE 101 05 982 A1, the entire disclosed content of which is hereby incorporated herein by reference as part of the present subject matter of the application. Irrespective of this, however, the subject matter of the application can be applied to current and voltage measurement in generalized form.

Figure 1:
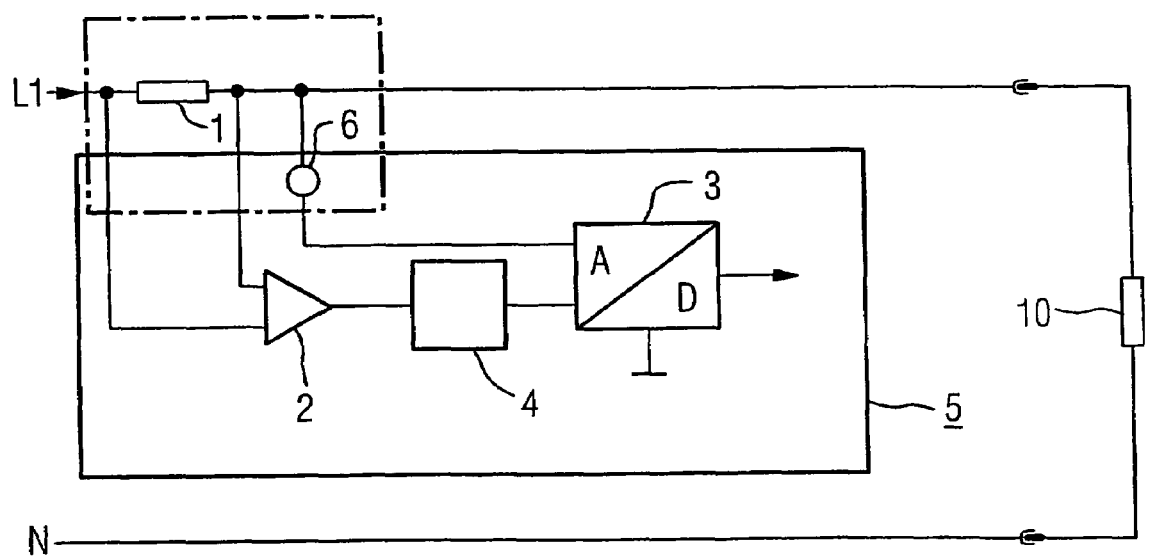
FIG. 1 shows the arrangement of a measuring device, which has a shunt at a high potential, and the shunt resistor.

FIG. 1 shows one advantageous arrangement of the shunt resistor and measuring device. In accordance with FIG. 1 in DE 101 05 982 A1, a phase L1 that is at a high potential contains a shunt 1 which uses an amplifier 2 to provide an analog/digital converter 3 (as part of a measuring device 5) with the measurement voltage $U_{diff}1$. The voltage difference $U_{diff}$, which is regarded as being a measure of the current through the shunt 1, is converted by the analog/digital converter (ADC) 3 into a binary measured value and is transmitted at ground potential in the form of a binary signal.

Connected upstream of the ADC 3 is a unit 4 for signal compression which can be used, in particular, to take a high signal dynamic response into account in a cost-effective manner, the binary signal being subjected to reverse expansion after it has been transmitted. The expansion can be effected at ground potential using software in the relevant evaluation unit, particularly in the microcontroller which is usually provided.

In the case of current measurements using a shunt, the effect of ambient temperature on accuracy is known and should not be ignored: the shunt resistance is dependent on temperature in accordance with the following function:

$$R_s = R_0(1 + a*T) \qquad (1).$$

FIG. 1 is furthermore used to show that, by thermally coupling the shunt 1 and measuring device 5, the temperature response of the shunt resistor is compensated for by a temperature response of equal magnitude from a reference voltage source 6 with a function corresponding to that for the resistance:

$$U_{ref} = U_0(1 + a*T) \qquad (2).$$

Figure 2:
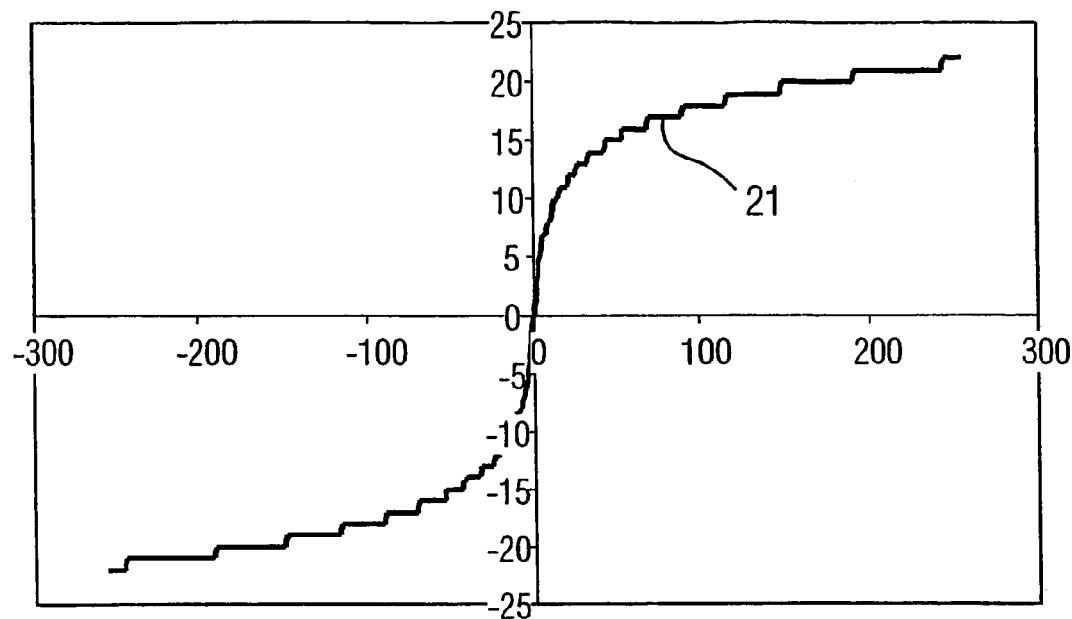
FIG. 2 shows a logarithmically compressed code for use in the measuring device shown in FIG. 1.
Figure 3:
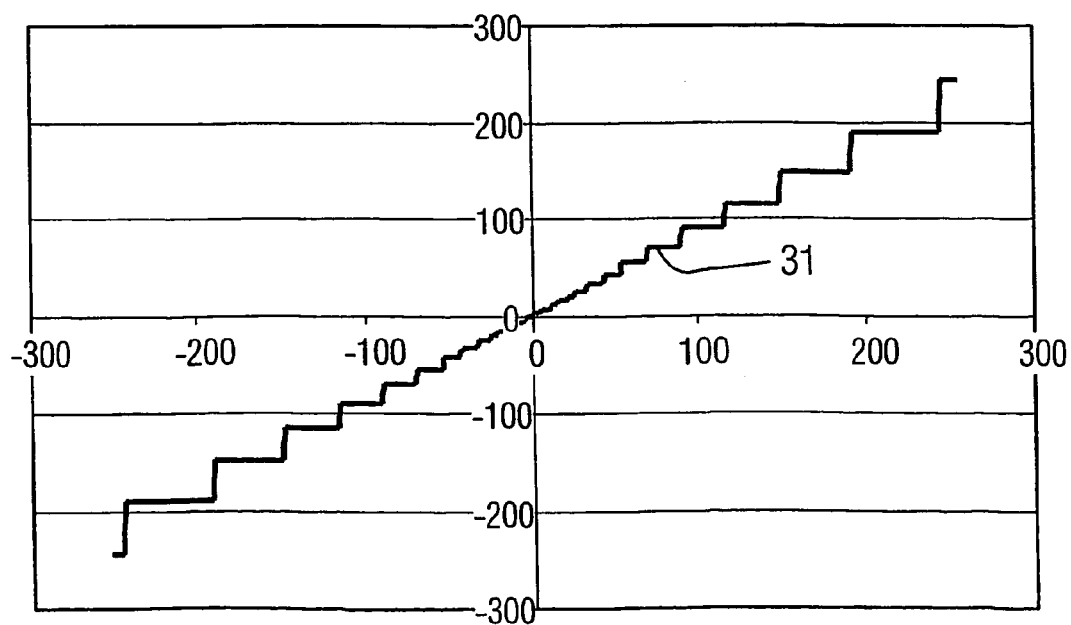
FIG. 3 shows a logarithmically expanded measured value for use in the measuring device shown in FIG. 1.
Figure 4:
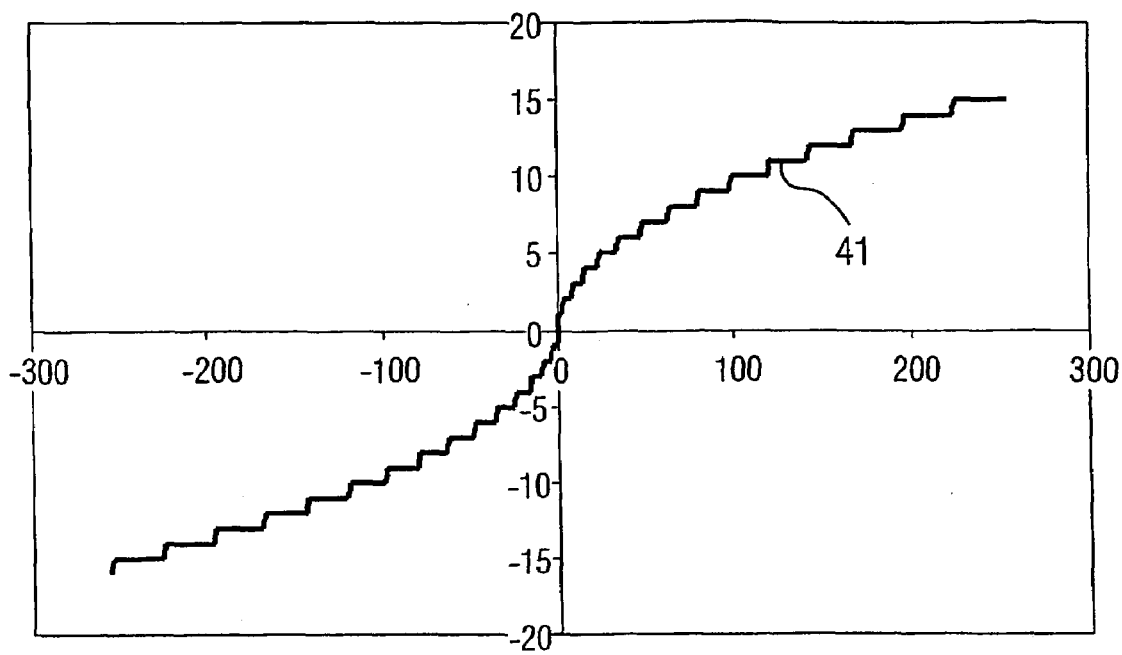
FIG. 4 shows, as an alternative to FIG. 2, a code which has been compressed in accordance with a square root curve.
Figure 5:
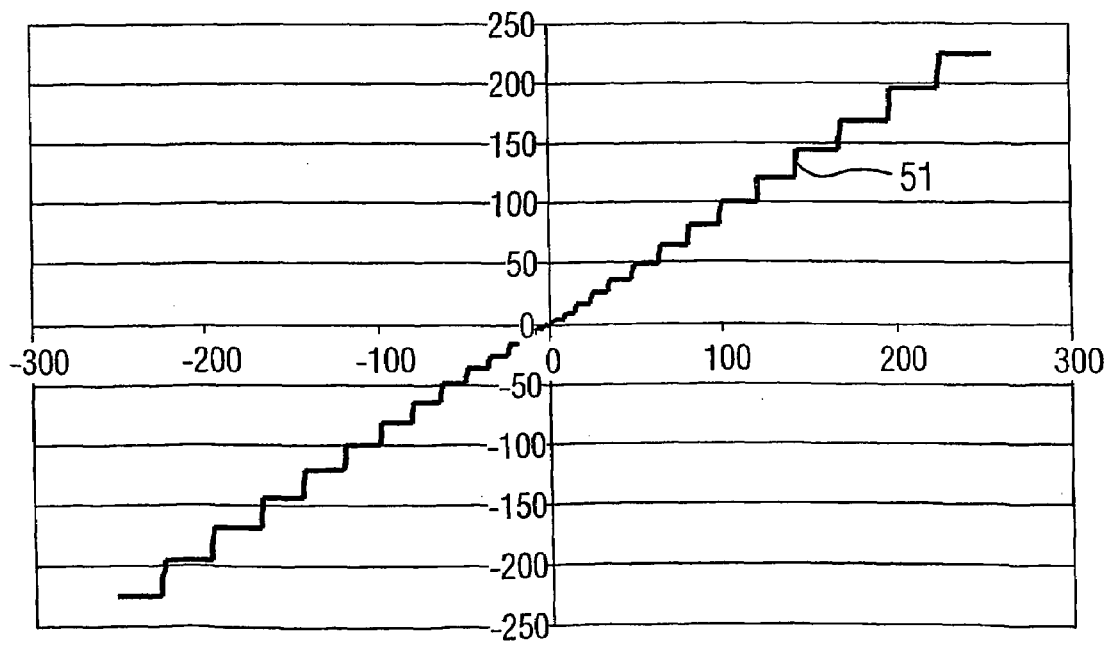
FIG. 5 shows, as an alternative to FIG. 3, a measured value which has been expanded in accordance with a square function.

FIGS. 2 and 3 show the signals for logarithmic compression/expansion and FIGS. 4 and 5 show those for root/square compression/expansion. 21, 31, 41 and 51 are used to denote the relevant characteristic curves.

Figure 6:
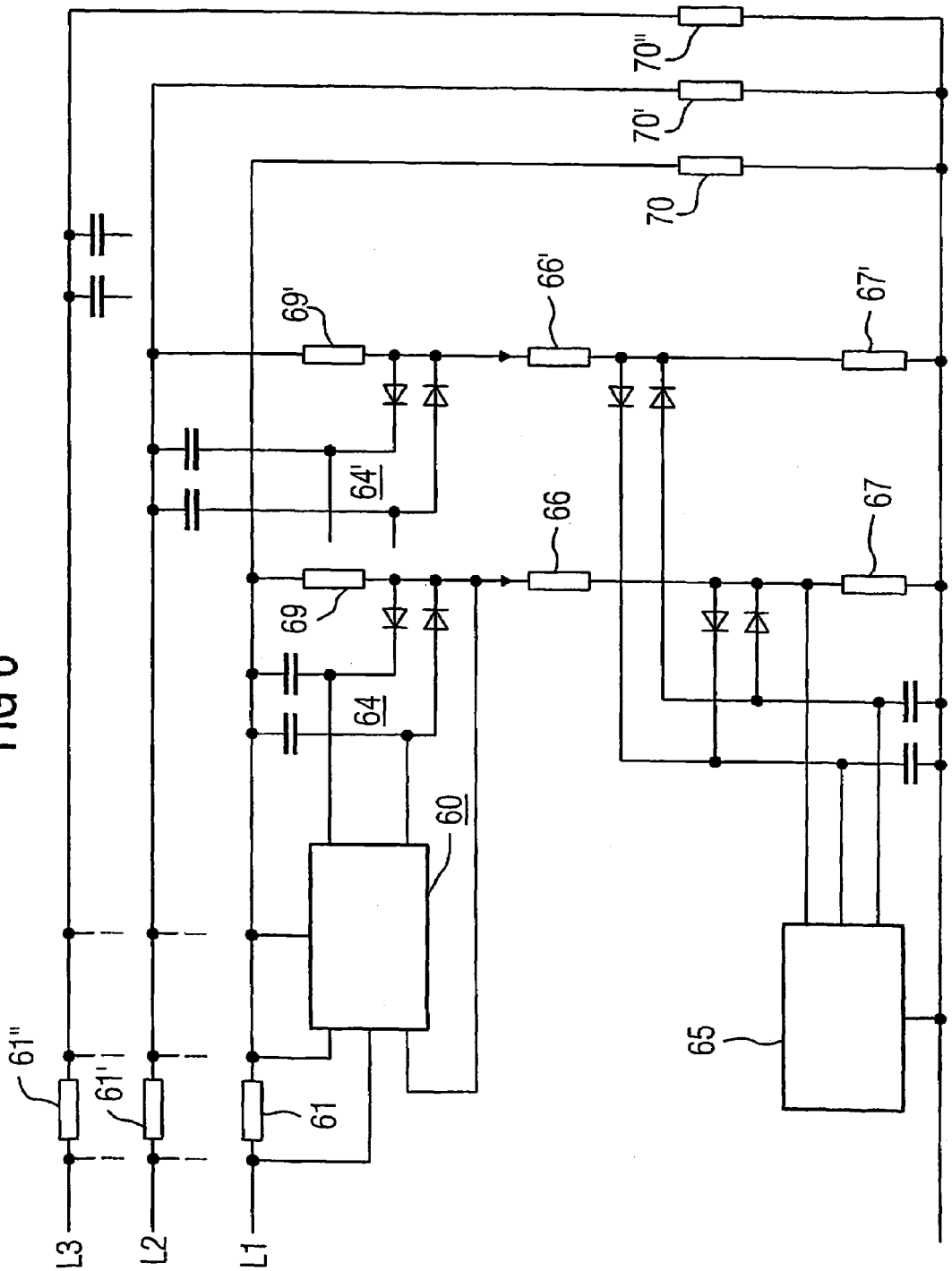
FIG. 6 shows an arrangement for measuring the current and voltage in a three-phase system.

FIG. 6 shows a measuring device for measuring the current and voltage in a three-phase system having phases L1, L2 and L3. The evaluation channel for L1 has been set out in full but the identical channels for L2 and L3 have been set out only partially. The fundamental factor in this case is that the individual channels contain three identical shunt resistors 61, 61', 61'' which are each connected to a measuring unit 60 that corresponds to the measuring device 5 shown in FIG. 1.

Both the voltage supply at a high potential and the voltage supply at a low potential are obtained from the system using the voltage divider 66, 66' and 67, 67'. Resistors 69, 69' at a high potential and further switching elements such as capacitors and blocking diodes are furthermore provided, with 64, 64' being used to denote the means for signal rectification as a whole.

The switching elements which are used to effect the desired signal compression and signal expansion (which is the inverse of the latter) in accordance with the characteristic curves shown by way of example in FIGS. 2 to 5 is integrated in the measuring unit 60 in FIG. 6.

In FIG. 6, the neutral conductor N is connected to the loads 70, 70', 70'', and a star point is formed. Alternatively, the three voltage dividers form an artificial star point in the switching device when the neutral conductor is not connected, which, for reasons of cost, corresponds to the normal situation.

The voltage drops across the lower and upper resistors may alternatively be used to measure the voltage. If the upper voltage is being measured, the two measured values, i.e. current and voltage, are transmitted at a low potential using the modulated supply current.

Figure 7:
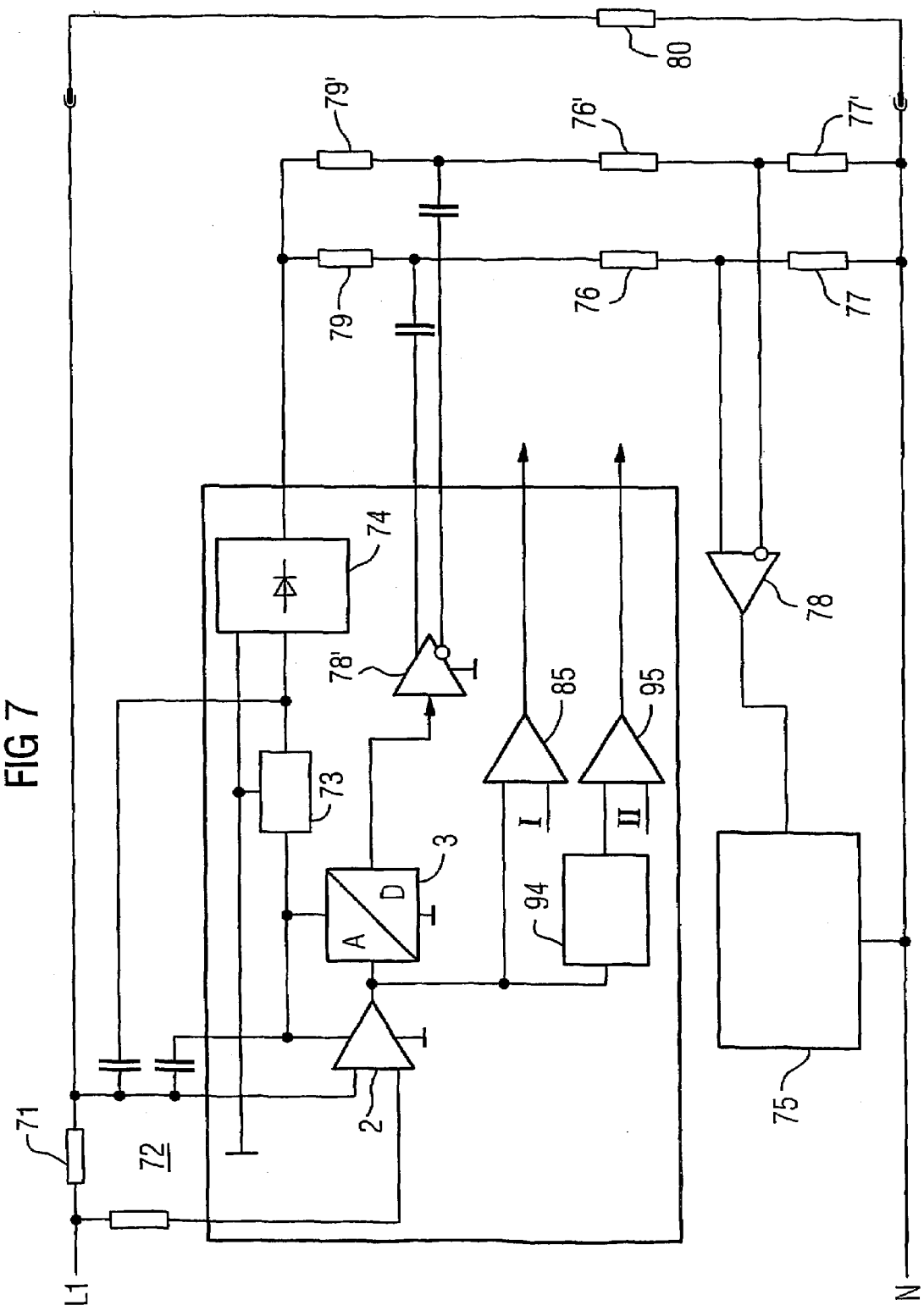
FIG. 7 shows an alternative arrangement having means for short-circuit and/or overload disconnection.

FIG. 7 shows the design of a circuit arrangement having a measuring unit 60 in accordance with FIG. 6. The shunt 71 having circuit elements 72 uses a control unit 73 and a rectifier 74 to drive voltage dividers: specifically, voltage dividers have been constructed in this case from resistors 76, 76' and 77, 77' and alternatively 79, 79', the current being supplied either at a high potential or a low potential.

Connected downstream of the amplifier 2 (provided in FIG. 7 in accordance with FIG. 1) and the AD converter 3 is a differential amplifier 78' which is capacitively coupled to the voltage dividers via capacitors (which are not denoted further).

Device(s) for short-circuit and overload disconnection may be additionally provided: for this purpose, the circuit may contain, in addition to the elements which have already been described, an apparatus including two comparators 85 and 95 having two threshold values which are independent of one another and can each be set. The first comparator 85 compares the instantaneous current value with the threshold I and, in the event of the threshold being exceeded, outputs a signal for short-circuit identification which can be used to disconnect the main circuit. The second comparator 95 compares the instantaneous temperature value of the load (which value is obtained using a thermal model 94) with the threshold II and, in the event of said threshold being exceeded, outputs a signal for overload identification which can be used to disconnect the main circuit. Just one of the two comparators may also be provided.

The parallel voltage dividers having the resistors 76, 76' and 77, 77' and 79, 79' use a differential amplifier 78 to provide the evaluation unit 75 with a signal at a low potential. The evaluation unit 75 may be a microcontroller and corresponds to the unit 65 shown in FIG. 6.

The described method with the associated circuit arrangement is particularly suited to measuring the current at potential and evaluating the measurement signals which occur, at a higher potential than zero potential, in the form of an analog value and whose measurement information, after A/D conversion, is transmitted in the form of a digital signal to an evaluation unit which is at ground potential. In this case, the digital signal produced provides the clock for modulating the supply current and thus likewise performs the function of the carrier for the information content of the measurement signal. Rounded characteristic curves are advantageously used to compress/decompress the signals. Suitable devices/methods for temperature compensation may be likewise provided.

Exemplary embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A method for current measurement through a conductor at a potential which is at a higher value than zero potential, comprising:
    measuring the voltage drop across a shunt resistance to determine the current value in the form of an analog signal, the shunt resistance being formed by a section of the conductor in which the electrical resistance is increased locally by reducing the cross-section of the conductor;
    converting the analog signal to a digital signal using an analog/digital converter;
    supplying a reference voltage to the analog/digital converter to compensate for a temperature dependence of the shunt resistance, a temperature course of the reference voltage at least approximately corresponding to a temperature course of the shunt resistance; and
    transmitting the digital signal to an evaluation unit which is at ground potential;
    wherein the analog signal is subjected to compression based on a non-linear characteristic of the analog/digital converter, and the digital signal is subjected to expansion after transmission at ground potential.

2. The method as claimed in claim 1, wherein compression and expansion are effected logarithmically.

3. The method as claimed in claim 1, wherein compression and expansion are effected on the basis of the stipulation of root functions.

4. The method as claimed in claim 1, in which, in order to evaluate a measurement signal which, at a higher potential than zero potential, is in the form of an analog value in a measuring device that requires a supply current, having the following measures:
    the compressed information content of the measurement signal is transmitted, after A/D conversion, in the form of a digital signal to the evaluation unit, which is at ground potential, and
    after A/D conversion of the measurement signal, the digital signal produced provides the clock for modulating the supply current, with the result that the modulated supply current for the measuring device likewise performs the function of the carrier for the information content of the measurement signal.

5. A circuit arrangement for carrying out the method as claimed in claim 1 for use when measuring the current at a shunt, in which the voltage drop is evaluated as a measure of the current after amplification, said circuit arrangement comprising a shunt, an amplifier for the voltage signal that is tapped off at the shunt, an analog/digital converter, an evaluation unit, means for supplying the measuring components with current, and further means for signal compression and signal expansion.

6. The circuit arrangement as claimed in claim 5, further comprising means for temperature compensation.

7. The circuit arrangement as claimed in claim 6, wherein the means for temperature compensation includes a temperature-dependent reference voltage source.

8. The circuit arrangement as claimed in claim 5, wherein a unit for signal compression is connected upstream of the A/D converter.

9. The circuit arrangement as claimed in claim 5, wherein the means for signal expansion are integrated in the evaluation unit.

10. The circuit arrangement as claimed in claim 5, further comprising means for at least one of short-circuit disconnection and overload disconnection.

11. The circuit arrangement as claimed in claim 10, further comprising a first comparator, which compares the instantaneous value of the current with a first threshold value and produces a signal for short-circuit disconnection when said first threshold value is exceeded.

12. The circuit arrangement as claimed in claim 10, further comprising a second comparator, which compares the instantaneous temperature of the load with a second threshold value and outputs a signal for overload disconnection when said second threshold value is exceeded.

13. The circuit arrangement as claimed in claim 12, further comprising a thermal model of the load, said model being used to ascertain the instantaneous temperature of the load from the current measured.

14. The circuit arrangement as claimed in claim 5, wherein the means for signal expansion are integrated in the evaluation unit in the existing microcontroller, in the form of software.

* * * * *